United States Patent
Merck et al.

(10) Patent No.: US 7,859,378 B2
(45) Date of Patent: Dec. 28, 2010

(54) HOUSING FOR INDUCTIVE COUPLER FOR POWER LINE COMMUNICATIONS

(75) Inventors: Erik S. Merck, Sharon, MA (US); Ram Das S. Rao, Brighton, MA (US); David Goldblatt, Chestnut Hill, MA (US); Kokou A. Amefia, Boston, MA (US)

(73) Assignee: Ambient Corporation, Newton, MA (US)

( * ) Notice: Subject to any disclaimer, the term of this patent is extended or adjusted under 35 U.S.C. 154(b) by 0 days.

(21) Appl. No.: 12/310,834

(22) PCT Filed: Sep. 14, 2007

(86) PCT No.: PCT/US2007/020046
§ 371 (c)(1),
(2), (4) Date: Mar. 9, 2009

(87) PCT Pub. No.: WO2008/033527
PCT Pub. Date: Mar. 20, 2008

(65) Prior Publication Data
US 2010/0066475 A1    Mar. 18, 2010

Related U.S. Application Data

(60) Provisional application No. 60/844,509, filed on Sep. 14, 2006.

(51) Int. Cl.
*H01F 38/20* (2006.01)
*H01F 27/02* (2006.01)

(52) U.S. Cl. .......................... 336/90; 336/174
(58) Field of Classification Search ............... 336/174, 336/175
See application file for complete search history.

(56) References Cited

U.S. PATENT DOCUMENTS

| | | | |
|---|---|---|---|
| 5,003,278 A * | 3/1991 | May | 336/92 |
| 5,355,109 A * | 10/1994 | Yamazaki | 336/92 |
| 5,426,360 A | 6/1995 | Maraio et al. | |
| 5,942,964 A * | 8/1999 | Takeuchi | 336/92 |
| 6,127,465 A | 10/2000 | Nodera | |
| 6,335,672 B1 * | 1/2002 | Tumlin et al. | 336/175 |
| 6,512,425 B2 * | 1/2003 | Morita et al. | 333/12 |
| 6,756,776 B2 | 6/2004 | Perkinson et al. | |
| 7,002,333 B2 | 2/2006 | Blasco Claret et al. | |
| 7,078,996 B1 * | 7/2006 | Cern et al. | 336/175 |
| 7,102,478 B2 * | 9/2006 | Pridmore et al. | 336/176 |
| 7,319,376 B2 * | 1/2008 | Kobayashi et al. | 336/175 |
| 7,360,610 B2 * | 4/2008 | Hall et al. | 175/61 |
| 2003/0222748 A1 * | 12/2003 | Cern et al. | 336/178 |

OTHER PUBLICATIONS

International Search Report Application No. PCT/US07/20046, dated Mar. 17, 2008.

* cited by examiner

*Primary Examiner*—Anh T Mai
(74) *Attorney, Agent, or Firm*—Ohlandt, Greeley, Ruggiero & Perle, LLP

(57) ABSTRACT

There is provided an inductive coupler. The inductive coupler includes (a) a housing having an aperture that extends lengthwise through the housing, a gap that extends lengthwise along a side of the housing, and a flexible region that enables the gap to be opened or closed, wherein the gap, when opened, permits the inductive coupler to be installed on a conductor by having the conductor routed through the aperture. The inductive coupler also includes (b) a magnetic core; and (c) a winding wound around a portion of the magnetic core. The magnetic core and the winding are secured to the housing such that a position of the magnetic core and a position of the winding are maintained relative to one another. The inductive coupler, when installed on the conductor, couples a signal between the conductor and the winding via the magnetic core.

17 Claims, 13 Drawing Sheets

HOUSING FOR INDUCTIVE COUPLER FOR POWER LINE COMMUNICATIONS

BACKGROUND OF THE INVENTION

1. Field of the Invention

The present invention relates to power line communications, and, more particularly, to a configuration of a data coupler for power line communications.

2. Description of the Related Art

Power line communications (PLC), also known as broadband over power line (BPL), is a technology that encompasses transmission of data at high frequencies through existing electric power lines, i.e., conductors used for carrying a power current. A data coupler for PLC couples a data signal between a power line and a communication device such as a modem.

An example of such a data coupler is an inductive coupler that includes a core, and a winding wound around a portion of the core. The inductive coupler operates as a transformer, where the core is situated on a power line such that the power line serves as a primary winding of the transformer, and the winding of the inductive coupler is a secondary winding of the transformer.

The core is typically constructed of a magnetic material, such as a ferrite, a powdered metal, or a nano-crystalline material. The core is electrified by contact with the power line and requires insulation from the secondary winding. Typically, the core and the secondary winding are insulated by embedding both the core and the secondary winding in electrically insulating material, such as silicone.

At times, an electric utility lineman may be required to install an inductive coupler on an energized medium such as a high voltage power line. As such, the inductive coupler is required to meet safety requirements, to avoid injury to personnel performing installation, maintenance or removal thereof.

SUMMARY OF THE INVENTION

There is provided an inductive coupler. The inductive coupler includes (a) a housing having an aperture that extends lengthwise through the housing, a gap that extends lengthwise along a side of the housing, and a flexible region that enables the gap to be opened or closed. The gap, when opened, permits the inductive coupler to be installed on a conductor by having the conductor routed through the aperture. The inductive coupler also includes (b) a magnetic core; and (c) a winding wound around a portion of the magnetic core. The magnetic core and the winding are secured to the housing such that a position of the magnetic core and a position of the winding are maintained relative to one another. The inductive coupler, when installed on the conductor, couples a signal between the conductor and the winding via the magnetic core.

DESCRIPTION OF THE INVENTION

In a PLC system, power current is typically transmitted through a power line at a frequency in the range of 50-60 hertz (Hz). In a low voltage line, power current is transmitted with a voltage between about 90 to 600 volts, and in a medium voltage line, power current is transmitted with a voltage between about 2,400 volts to 35,000 volts. The frequency of the data signals is greater than or equal to about 1 megahertz (MHz), and the voltage of the data signal ranges from a fraction of a volt to a few tens of volts.

Figure 1:
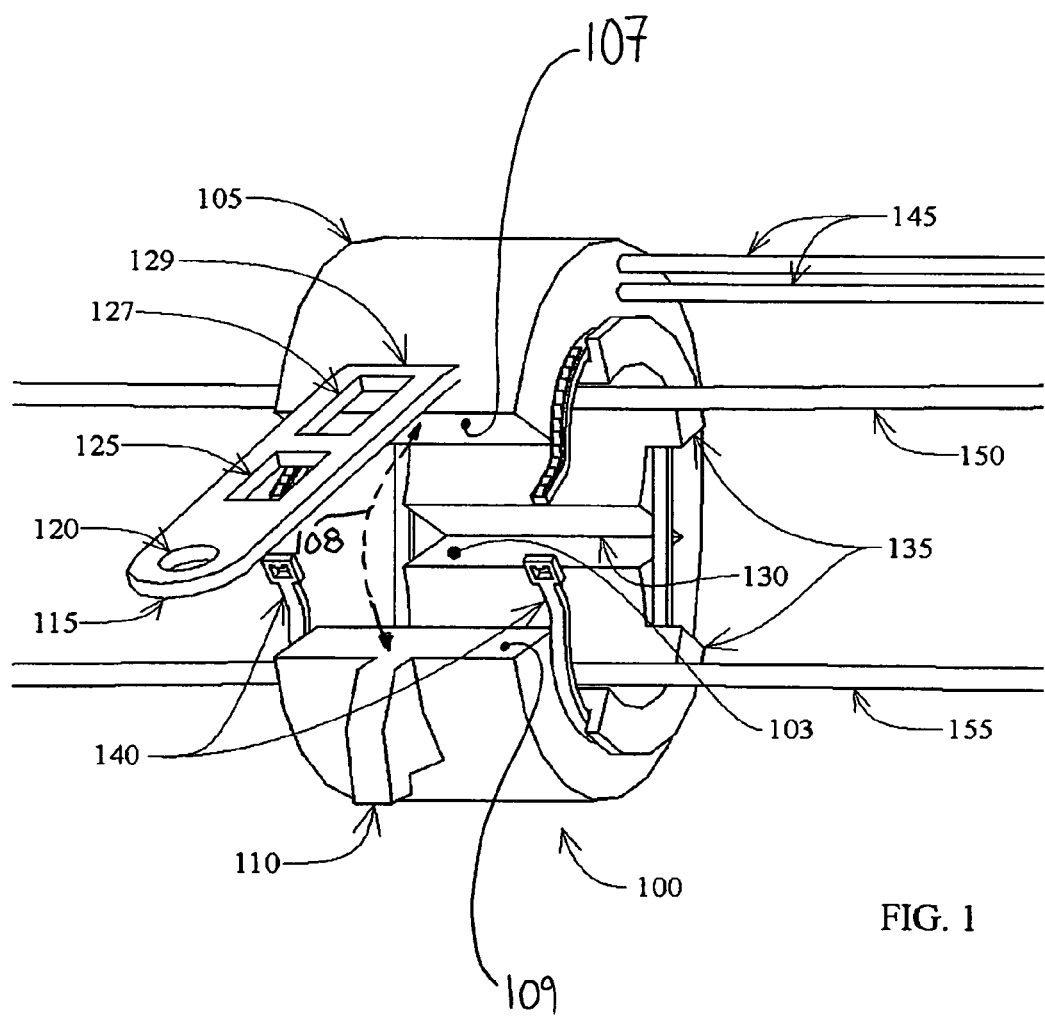
FIG. 1 is a three-dimensional view of an inductive coupler, in an open position.

FIG. 1 is a three-dimensional view of an inductive coupler 100 in an open position, situated for installation on power lines 150 and 155. Inductive coupler 100 includes a housing 105 that is of a one piece, uni-body construction. Housing 105 is fabricated of a hard plastic material, an elastic material, or a resilient material. An elastic material is capable of partially or fully returning to its original length or shape after being stretched or deformed. The elastic material preferably has an elongation of about 10% to about 900% utilizing test method ASTM D1456-86, Standard Test Method For Rubber Property-Elongation at Specific Stress. A resilient material absorbs energy when it is deformed elastically and then, upon unloading, recoverably releases that energy.

Housing 105 includes an aperture 103 that runs lengthwise through housing 105. Power lines 150 and 155 are routed through aperture 103. Housing 105 also includes a magnetic core 200 (shown in FIG. 2), and a winding 145 that is wrapped around magnetic core 200. Winding 145 protrudes from housing 105 and connects to other electronic equipment (not shown) within a PLC system. Inductive coupler 100 operates as a transformer, where, for example, power line 150 is a first winding, and winding 145 is a second winding, and couples a signal between power line 150 and winding 145 via magnetic core 200.

Housing 105 has a gap 108 (represented by a dashed line) that extends lengthwise along a side of housing 105. Gap 108 is situated between a face 107 and a face 109. Housing 105 has a flexible region 130 that allows for faces 107 and 109 to be (a) separated apart from one another, thus opening gap 108, or (b) brought toward one another, thus closing gap 108. Thus, flexible region 130 functions similarly to a hinge. In FIG. 1, gap 108 is shown in an opened position.

Housing 105 includes a strap 115 and a protrusion 110. Strap 115 is attached to housing 105 at a junction 129, and has a hole 120, a notch 125, and a notch 127. Strap 115 can be configured as either an integral part of housing 105, or a non-integral part that is attached to housing 105 at junction 129. Housing 105 also has an end face with a pair of flanges, i.e., flanges 135. A cable tie 140 (two of which are shown in FIG. 1) is seated on flanges 135. The significance of strap 115, hole 120, notch 125, notch 127, protrusion 110, flanges 135 and cable tie 140 is described below, with reference to FIGS. 1A and 1B.

Figure 1A:
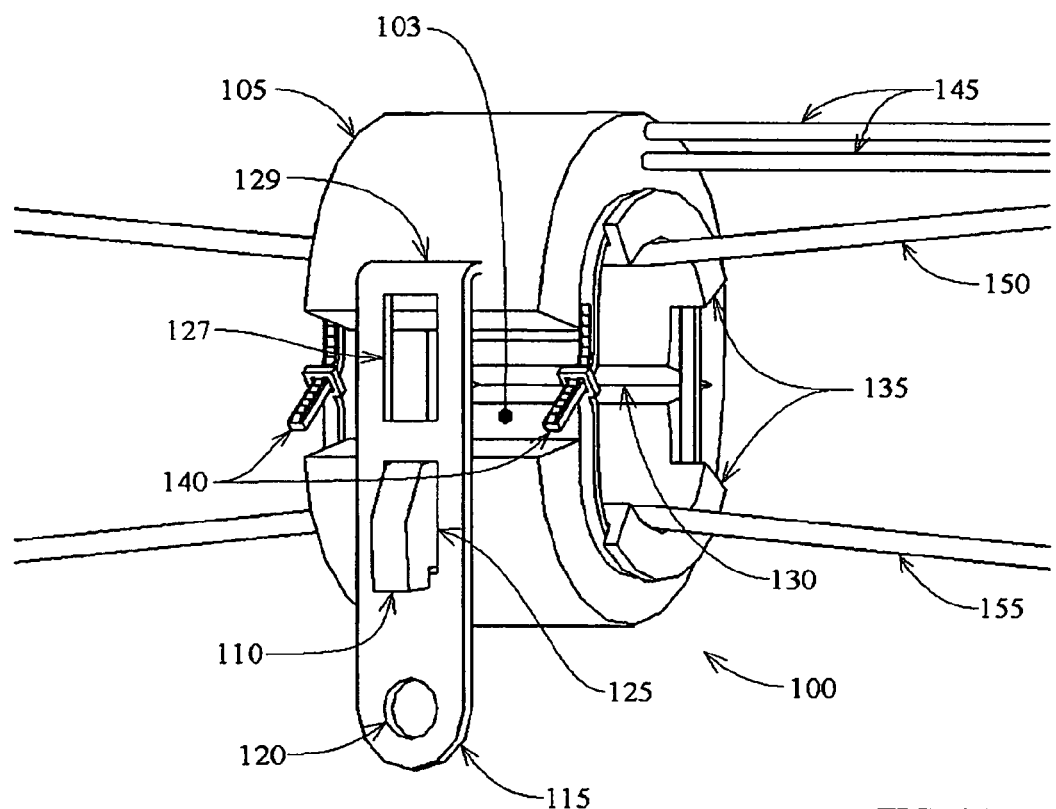
FIG. 1A is a three-dimensional view of the inductive coupler of FIG. 1 in a partially closed position.

FIG. 1A is a three-dimensional view of inductive coupler 100 in a partially-closed position. Strap 115 is bent toward protrusion 110 to effect engagement of notch 125 and protrusion 110. Cable tie 140 is self-engaged, and forms a perimeter that encompasses flanges 135. If cable tie 140 is tightened, the perimeter will be reduced, thus drawing flanges 135 toward one another.

Figure 1B:
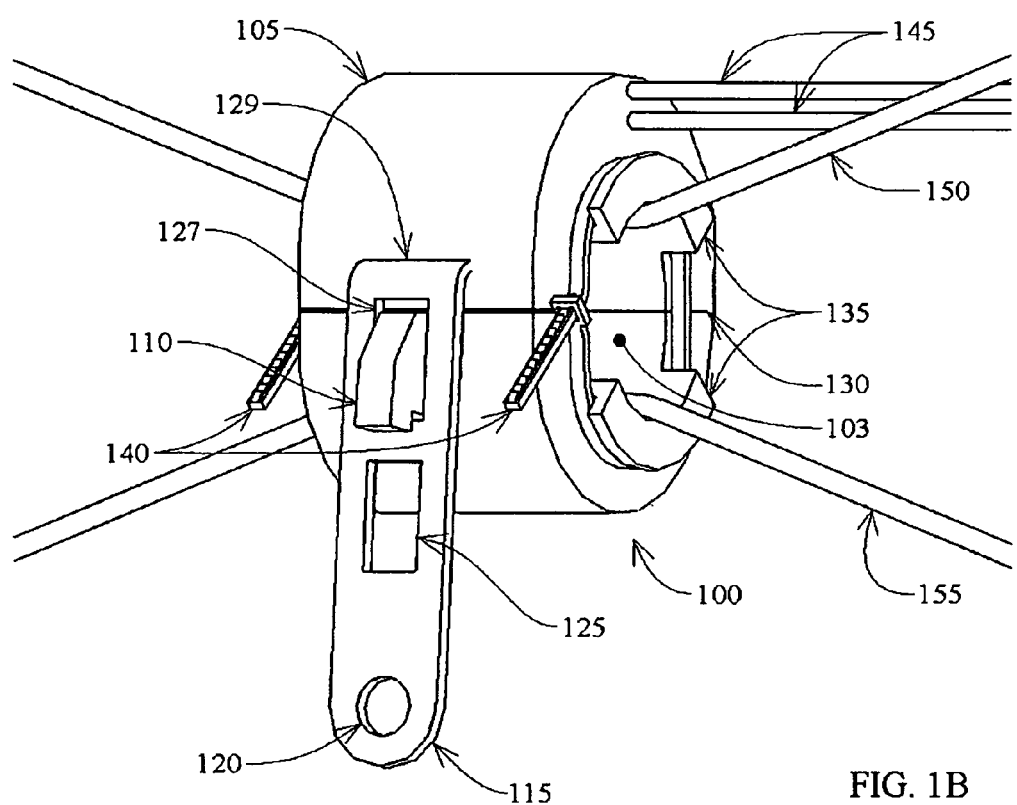
FIG. 1B is a three-dimensional view of the inductive coupler of FIG. 1 in a fully closed position.

FIG. 1B is a three-dimensional view of inductive coupler 100 in a fully closed configuration, installed on power lines 150 and 155. Cable tie 140 has been tensioned to effect closure of housing 105. Strap 115 has been bent to effect engagement of notch 127 and protrusion 110. The tension in cable tie 140 provides additional support for bundling power lines 150 and 155 together.

Figure 2:
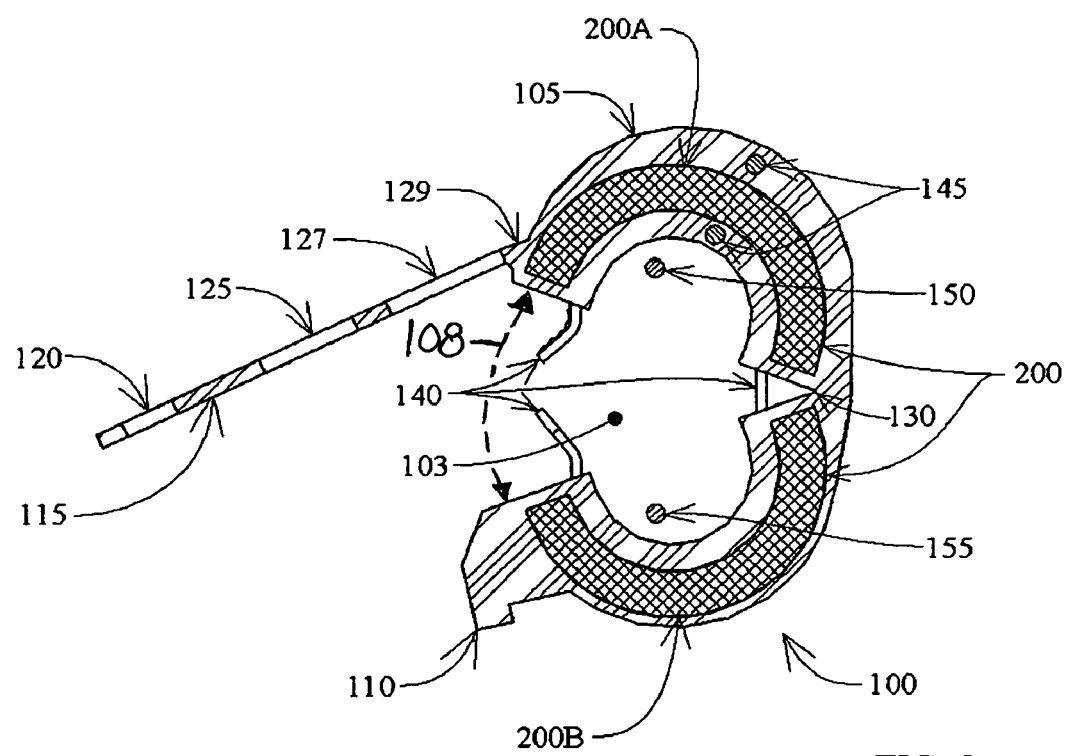
FIG. 2 is a cross-sectional view of the inductive coupler of FIG. 1.

FIG. 2 is a cross-sectional view of inductive coupler 100 in its open position. As mentioned earlier, inductive coupler 100 includes magnetic core 200. Magnetic core 200 is configured of a core section 200A and a core section 200B. Flexible region 130 allows for core halves 200A and 200B to be moved relative to one another. Configuring magnetic core 200 as two sections, i.e., core section 200A and core section 200B, facilitates a placement of inductive coupler 100 on power line 150. Core section 200A, core section 200B, and a looped portion of winding 145 are enclosed by housing 105. As such, housing 105 maintains a spatial relationship between winding 145, core section 200A and core section 200B. That is, magnetic core 200 and winding 145 are secured to housing 105 such that a position of magnetic core 200 and a position of winding 145 are maintained relative to one another.

To install inductive coupler 100 onto power lines 150 and 155, or to remove inductive coupler 100 from power lines 150 and 155, a lineman may use a long insulated tool typically termed a "hot stick." The hot stick has a hook that engages hole 120, to allow the lineman to move strap 115 so that notch 125 or notch 127 either engages protrusion 110, or disengages from protrusion 110.

Although FIGS. 1, 1A, 1B, and 2 show inductive coupler 100 in the context of an installation on two power lines, i.e. power lines 150 and 155, inductive coupler 100 can be installed on a single power line, and, more generally, one or more power lines.

In review, inductive coupler 100 includes housing 105, magnetic core 200, and winding 145. Aperture 103 extends lengthwise through housing 105, and gap 108 extends lengthwise along a side of housing 105 between faces 107 and 109. Flexible region 130 enables gap 108 to be opened or closed. Flexible region 130 may be, e.g., a hinge. Gap 108, when opened, permits inductive coupler 100 to be installed on a conductor routed through aperture 103. Winding 145 is wound around a portion of magnetic core 200. Further, magnetic core 200 and winding 145 are secured in such a way to housing 105 as to maintain a position relative to each other. When inductive coupler 100 is installed on a conductor, it couples a signal between the conductor and winding 145, via magnetic core 200.

Figure 3:
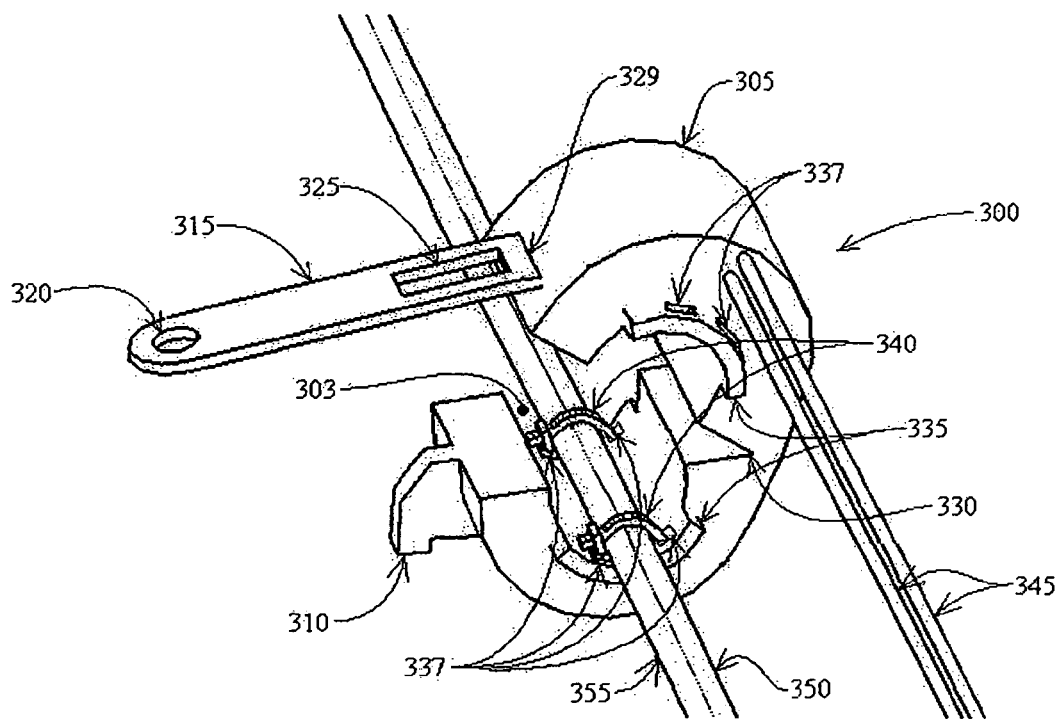
FIG. 3 is a three-dimensional view of an inductive coupler, in a partially open position, situated around power lines.

FIG. 3 is a three-dimensional view of an inductive coupler 300, in a partially open position, situated around a power line 350 and a power line 355. Inductive coupler 300 includes a housing 305 having an aperture 303 that extends lengthwise through housing 305. Inductive coupler 300 also includes magnetic core 200 (not shown in FIG. 3) and winding 145 (not shown in FIG. 3). Power lines 350 and 355 are routed through aperture 303. Winding 145 is wrapped around a portion of magnetic core 200. Leads 345 from winding 145 protrude from housing 305 and connect to components of a PLC system (not shown).

Housing 305 is of a one piece, uni-body construction, and is fabricated of a hard plastic material, an elastic material, or a resilient material. Housing 305 provides structural support for magnetic core 200. Housing 305 also has a flexible region 330, a strap 315, a protrusion 310, and flanges 335. Strap 315 extends from housing 305, attached thereto at a junction 329. Strap 315 has a hole 320 and a notch 325. Protrusion 310 and notch 325 are configured to engage one another. A user can obtain a grip on strap 315 at hole 320, and, by pulling thereon, cause strap 315 to flex about junction 329, and thereby effect engagement of notch 325 and protrusion 310, to secure inductive coupler 300 in a closed configuration.

Flanges 335 each include apertures 337. One cable tie 340 is routed through the apertures 337 in one of flanges 335, and another cable tie 340 is routed through the apertures in another one of flanges 335, to secure power lines 350 and 355 and inductive coupler 300 to one another.

Although FIG. 3 shows inductive coupler 300 installed on two power lines, i.e. power lines 350 and 355, with cable tie 340 fastened around power lines 350 and 355, inductive coupler 300 can be installed on a single power line, and, more generally, one or more power lines, with cable tie 340 being fastened around the one or more power lines.

Figure 4:
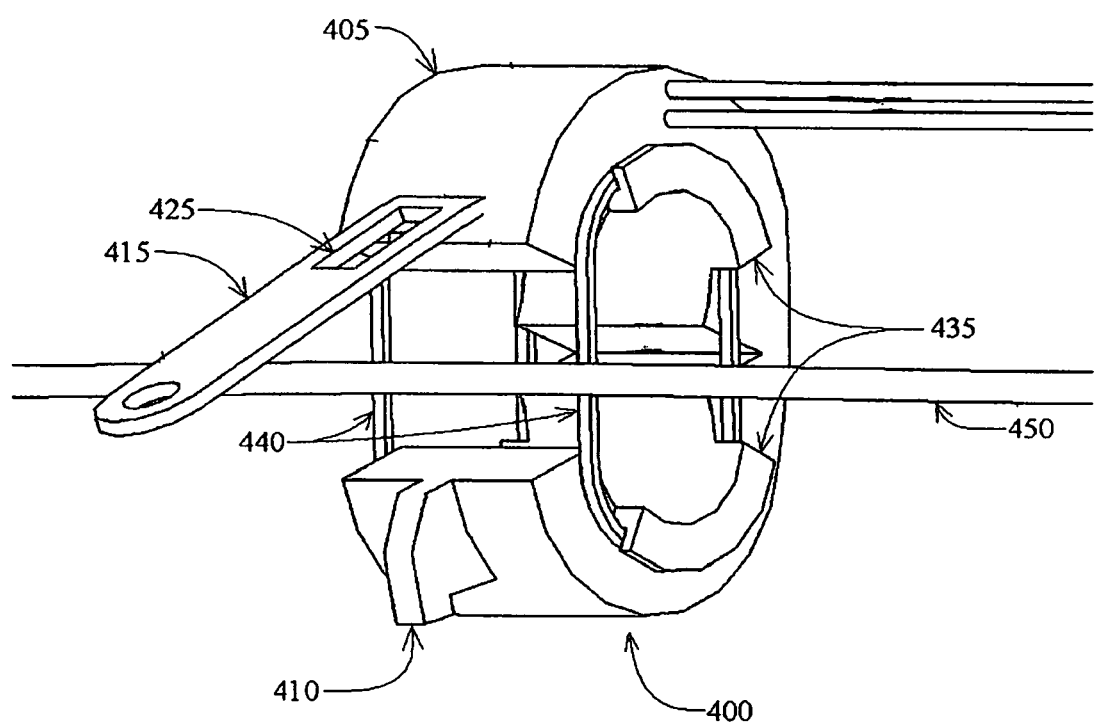
FIG. 4 is a three-dimensional view of an inductive coupler equipped with rubber bands.

FIG. 4 is a three-dimensional view of an inductive coupler 400. Inductive coupler 400 is similar to inductive coupler 300 in that inductive coupler 400 includes a housing 405, a strap 415, a notch 425, a protrusion 410 and flanges 435. Housing 405 is of a one piece, uni-body construction, and is fabricated of a hard plastic material, an elastic material, or a resilient material. Differently from inductive coupler 300, inductive coupler 400 includes a rubber band 440 (two of which are shown in FIG. 4). Rubber band 440 encompasses flanges 435 within a perimeter. When a power line 450 exerts contact forces on rubber band 440, the resulting tension in rubber band 440 causes a reduction in the perimeter, so that flanges 435 are drawn toward one another.

Figure 4A:
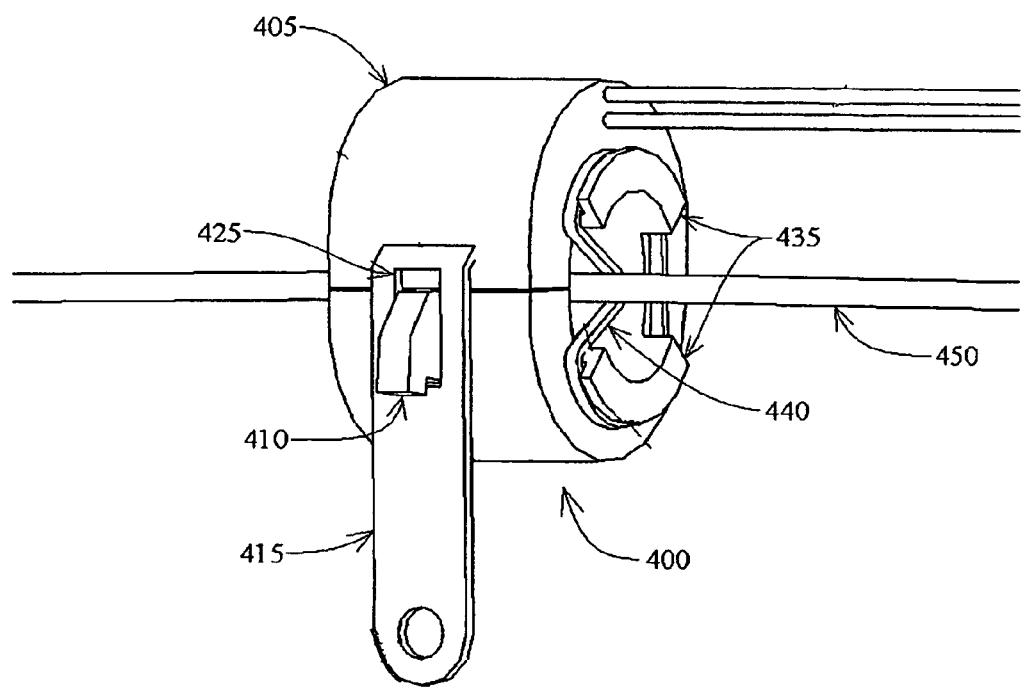
FIG. 4A is a three-dimensional view of the inductive coupler of FIG. 4 in a closed position, on a power line.

FIG. 4A is a three-dimensional view of inductive coupler 400 in a closed position about power line 450. Rubber band 440 is asserting tension against power line 450, and protrusion 410 is engaging notch 425.

Figure 5:
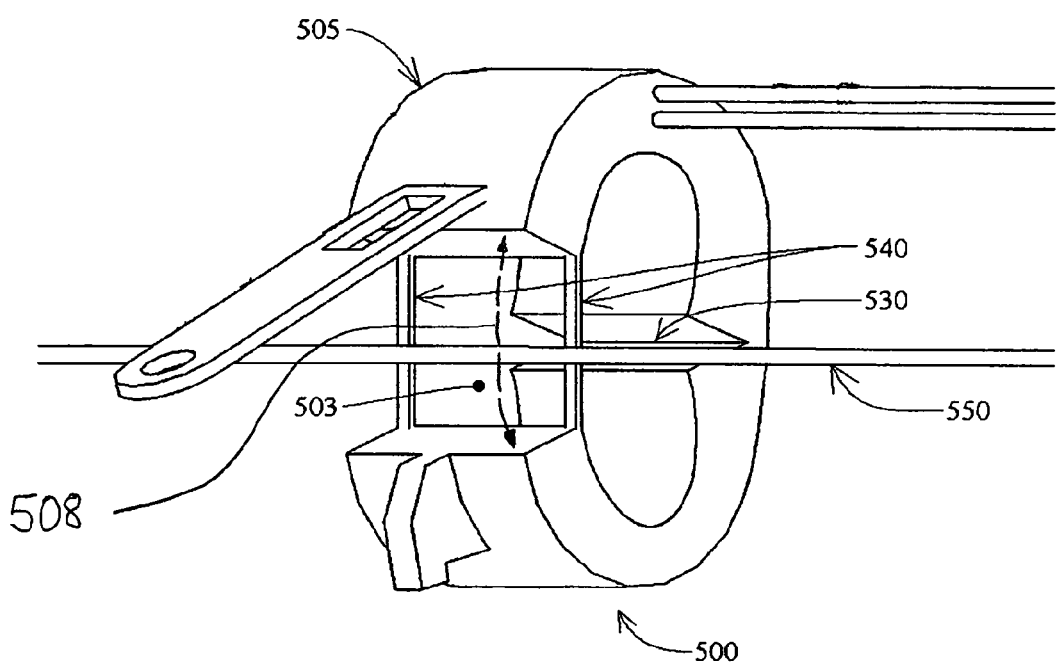
FIG. 5 is a three-dimensional view of an inductive coupler in an open position.

FIG. 5 is a three-dimensional view of an inductive coupler 500 in an open configuration, adjacent to a power line 550. Inductive coupler 500 has a housing 505 that includes an aperture 503 that runs lengthwise through housing 505, a gap 508 (represented by a dashed line) that extends lengthwise along a side of housing 505, and a flexible region 530. Housing 505 is of a one piece, uni-body construction, and is fabricated of a hard plastic material, an elastic material, or a resilient material. Inductive coupler 500 is similar to inductive coupler 400 except that instead of using a rubber band 440 around flanges 435, inductive coupler 500 uses an actuator 540 (two of which are shown in FIG. 5). Actuator 540 is an integral actuating structure, i.e., an integral part of housing 505. A design with non-integral actuators is also possible. That is, an actuator that is not an integral part of housing 505, for example, a rubber band.

Actuator 540 bridges gap 508. When power line 550 is pushed against actuator 540, toward aperture 503, actuator 540 moves away from gap 508. Housing 505 flexes about flexible region 530, and contact forces between power line 550 and actuator 540 effect a closure of aperture 503 and gap 508.

Figure 6:
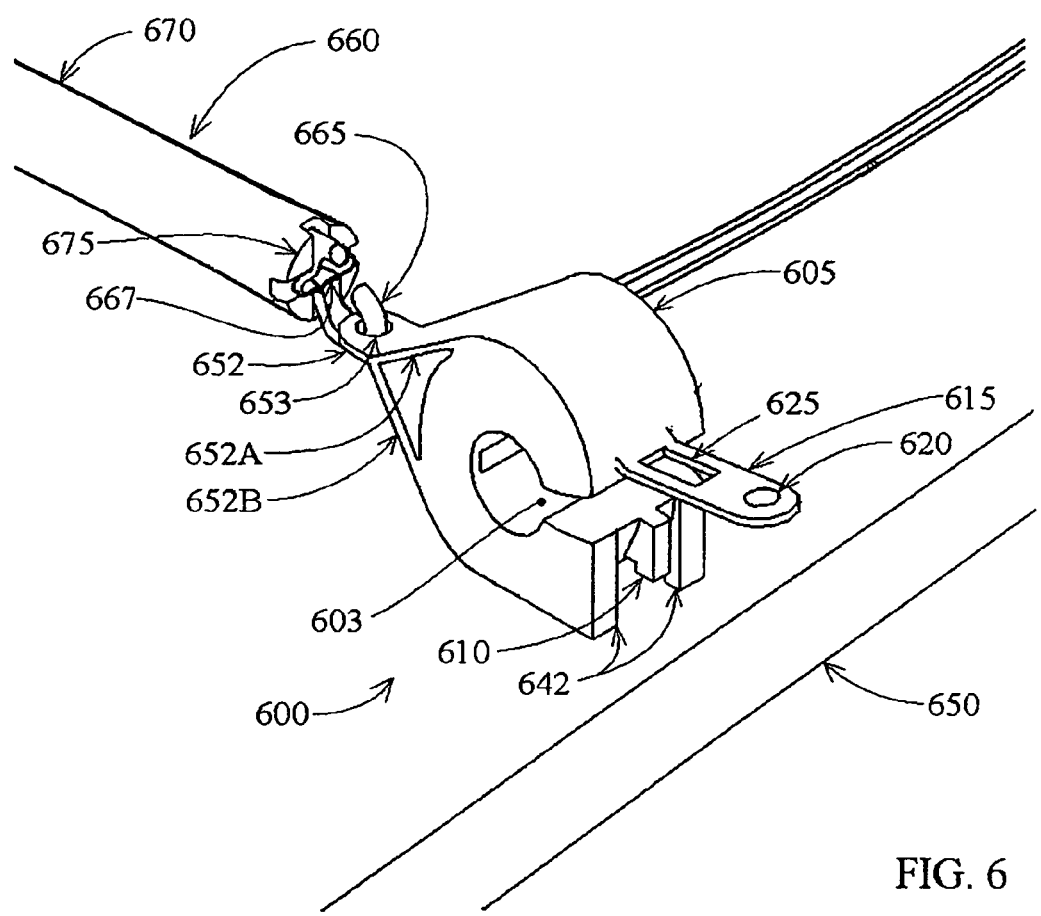
FIG. 6 is a three-dimensional view of an inductive coupler and a hot stick, situated adjacent to a power line.

FIG. 6 is a three-dimensional view of an inductive coupler 600 and a hot stick 660, situated adjacent to a power line 650. Inductive coupler 600 includes a housing 605 that has an aperture 603 that runs lengthwise through housing 605. Housing 605 is of a one piece, uni-body construction, and is fabricated of a hard plastic material, an elastic material, or a resilient material. Housing 605 includes a protrusion 610, and a strap 615 having a hole 620 and a notch 625. Housing 605 also includes nubs 642, a strap 652, a strap 652A and a strap 652B. Strap 652A connects strap 652 to a top portion of housing 605. Strap 652B connects strap 652 to a bottom portion of housing 605. Strap 652 has a hole 653. When housing 605 is made of a resilient material, and when housing 605 is at rest, a gap (similar to gap 108) that extends lengthwise along a side of housing 605 assumes a substantially closed position.

Hot stick 660 includes a hook 665, a hinge 667, a housing 670, and teeth 675. In FIG. 6, hook 665 is shown in an open position, and is routed through hole 653. Hook 665 can be retracted into housing 670, thus forcing hook 665 to close.

Figure 6A:
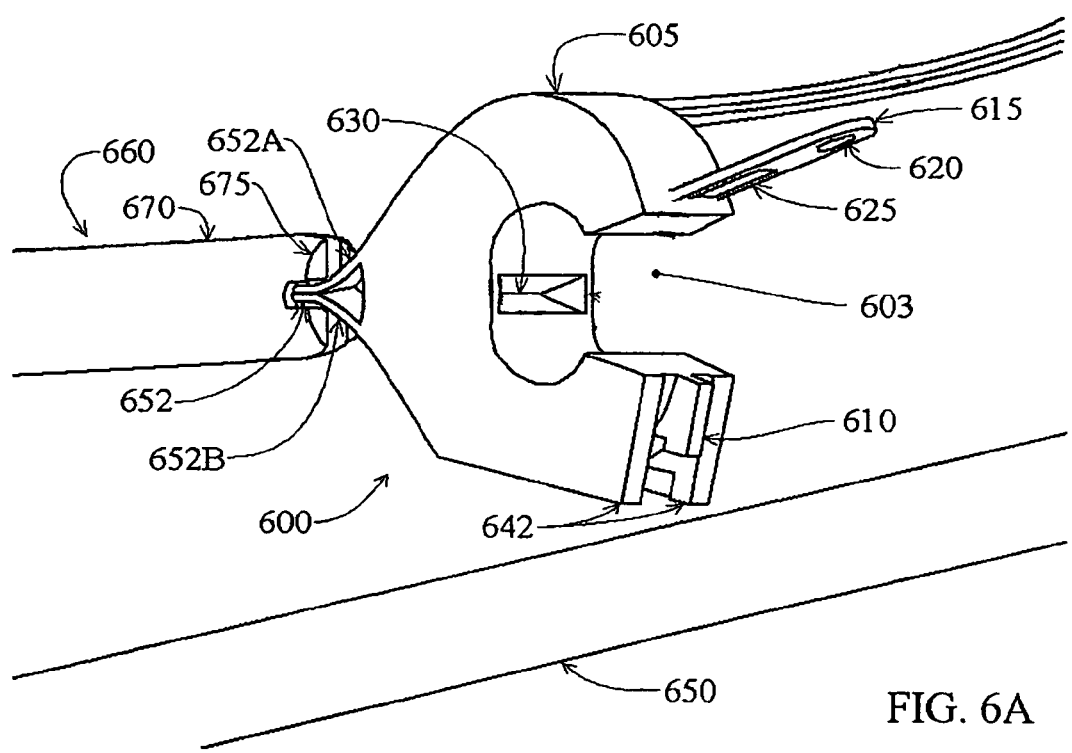
FIG. 6A is a three-dimensional view of the inductive coupler of FIG. 6, being held open by the hot stick.

FIG. 6A is a three-dimensional view of inductive coupler 600 engaged by hot stick 660 so that inductive coupler 600 is held open. In FIG. 6A, as compared to FIG. 6, hook 665 has been retracted into housing 670, thereby forcing straps 652A and 652B into closer proximity to one another. Housing 605 has a flexible region 630. Since straps 652A and 652B are forced into closer proximity to one another, housing 605 is opened about flexible region 630. With housing 605 thus opened, power line 650 can be introduced into aperture 603.

Figure 6B:
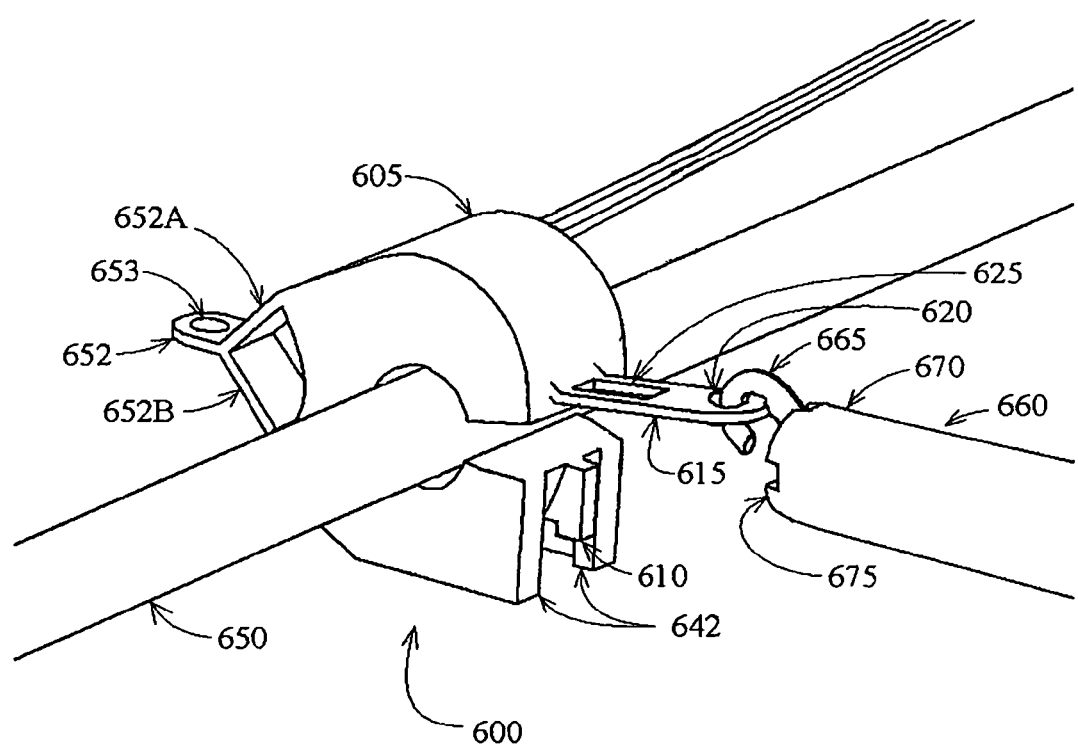
FIG. 6B is a three-dimensional view of the inductive coupler of FIG. 6, in a partially opened position, situated on the power line.

FIG. 6B is a three-dimensional view of inductive coupler 600 in an almost closed position, situated on power line 650. Inductive coupler 600 and hot stick 660, and their respective parts, are as depicted in FIG. 6, except that in FIG. 6B, hook 665 is engaging strap 615 through hole 620, and inductive coupler 600 is mostly closed around power line 650. A user may strap 615 downward to effect engagement of hole 620 and protrusion 610.

Figure 6C:
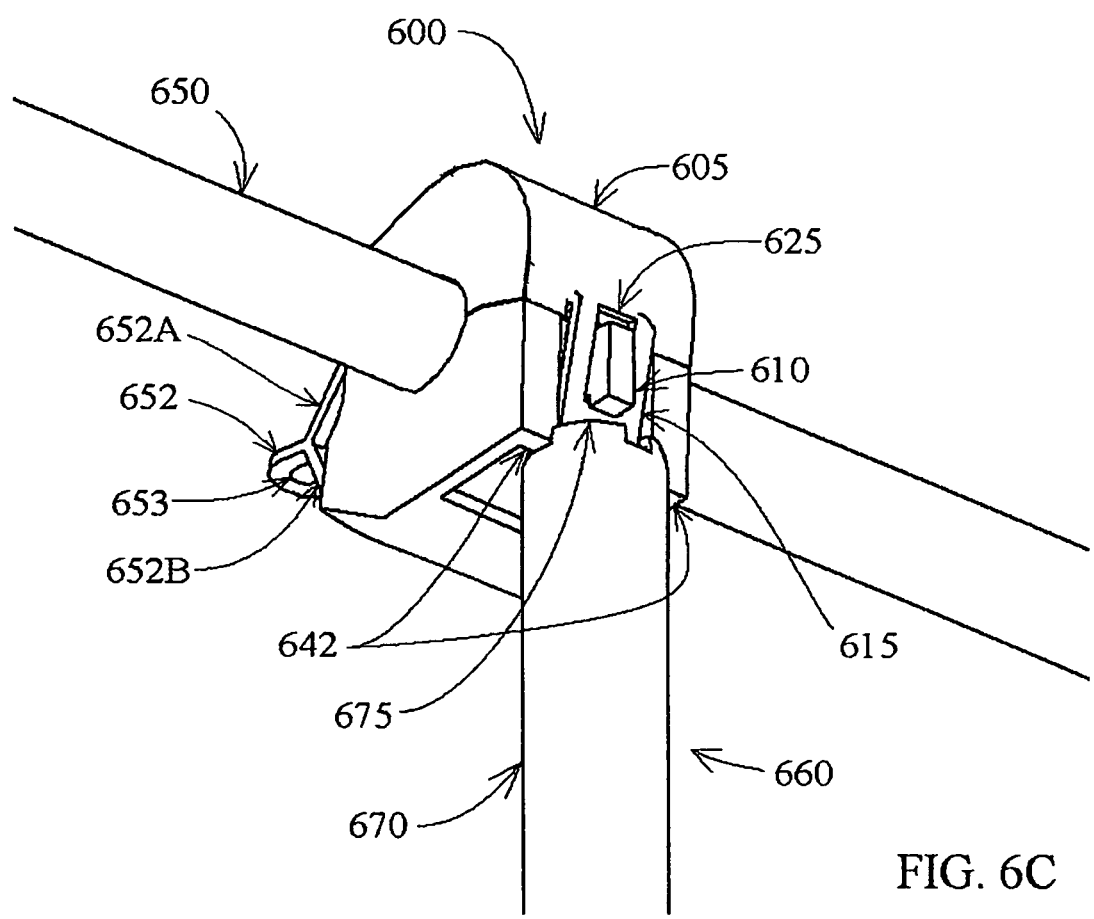
FIG. 6C is a three-dimensional view of the inductive coupler of FIG. 6, in a closed position, situated on the power line.

FIG. 6C is a three-dimensional view of inductive coupler 600 in a closed position on power line 650. Inductive coupler 600 and hot stick 660, and their respective parts, are as depicted in FIG. 6A, except that in FIG. 6C, a user has effected engagement of notch 625 and protrusion 610, thereby securely installing inductive coupler 600 on power line 650.

In FIG. 6C, teeth 675 are interlocking with nubs 642. This interlocking allows for housing 670 to produce an opposing force after hook 665 is looped through hole 620 (see FIG. 6B) and retracted into housing 670. While strap 615 is pulled down into housing 670, notch 625 seats over protrusion 610 to provide a positive closing of coupler 600 around power line 650.

Inductive coupler 600 has a magnetic core, similar to magnetic core 200, embedded within housing 605. When inductive coupler 600 is closed about, i.e. installed on, power line 650, housing 605 maintains a position of power line 650 and a position of the magnetic core relative to one another.

Figure 7:
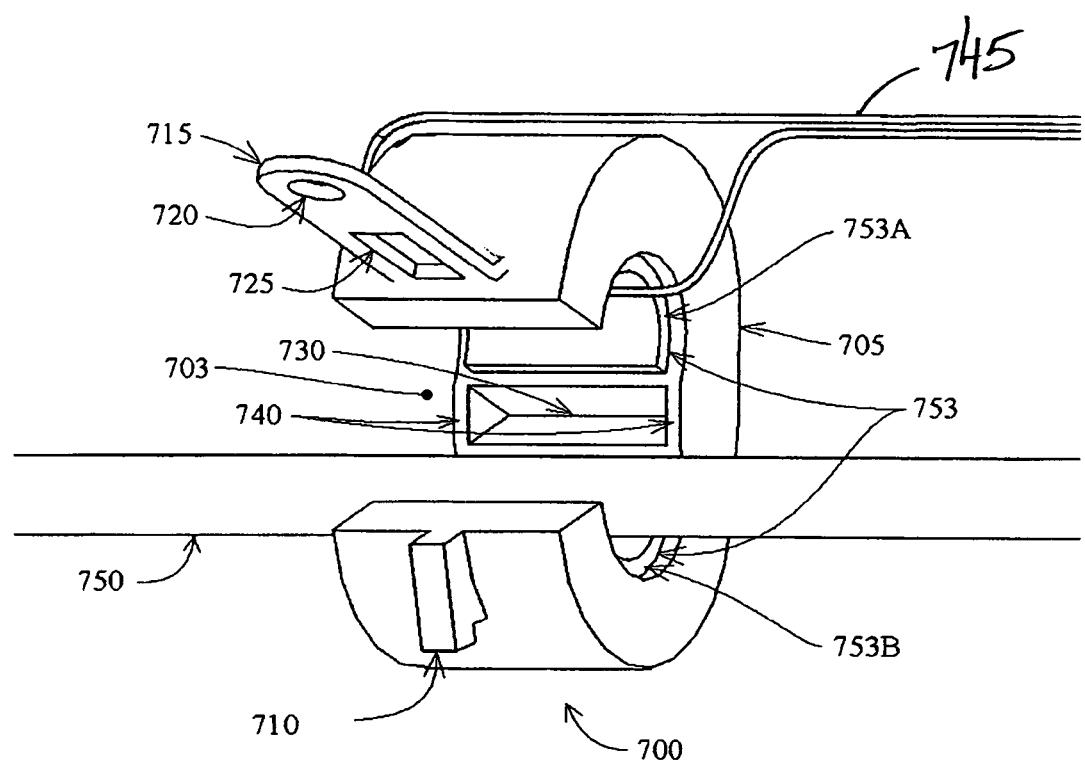
FIG. 7 is a three-dimensional view of an inductive coupler.

FIG. 7 is a three-dimensional view of an inductive coupler 700 in an open position, in close proximity to a power line 750. Inductive coupler 700 includes a housing 705, a magnetic core 753, and a winding 745.

Housing 705 is of a one piece, uni-body construction, and is fabricated of an elastic material. Housing 705 has a flexible region 730, a protrusion 710, and a strap 715 that has a hole 720 and a notch 725. Housing 705 also has an aperture 703 that extends lengthwise through housing 705.

Magnetic core 753 is configured of a core section 753A and a core section 753B. Winding 745 is wound around core section 753A. Magnetic core 753 is not completely embedded in housing 705, but instead, has an exposed surface that faces aperture 703. Winding 745 is not embedded in housing 705. Generally, for each of inductive couplers 100, 300, 400, 500 and 600, neither of the magnetic core nor the winding needs to be fully embedded within the housing, but instead, could be exposed in a manner similar to that of magnetic core 753 and winding 745.

Housing 705 also includes an actuator 740. Actuator 740 allows for core section 753A and core section 753B to be pulled away from one another, thus increasing the size of aperture 703. Inductive coupler 700 is then positioned around power line 750. Initially, external forces are applied to inductive coupler 700 via, gloved hands or hot stick (not shown), to hold inductive coupler 700 open. Once these forces are removed, actuator 740 contracts to loosely close inductive coupler 700 onto power line 750. Hole 720 can thereafter be engaged by a hook, so that strap 715 can be pulled down to effect an engagement of notch 725 and protrusion 710, thus establishing a positive closure of inductive coupler 700 around power line 750.

What is claimed is:
1. An inductive coupler, comprising:
    (a) a housing having:
        an aperture that extends lengthwise through said housing;
        a gap that extends lengthwise along a side of said housing; and
        a flexible region that enables said gap to be opened or closed,
        wherein said housing is configured as a uni-body device, and said flexible region is an integral component thereof, and
        wherein said gap, when opened, permits said inductive coupler to be installed on a conductor by having said conductor routed through said aperture;
    (b) a magnetic core; and
    (c) a winding wound around a portion of said magnetic core,
    wherein said magnetic core and said winding are secured to said housing such that a position of said magnetic core and a position of said winding are maintained relative to one another, and
    wherein said inductive coupler, when installed on said conductor, couples a signal between said conductor and said winding via said magnetic core.

2. The inductive coupler of claim 1, wherein said housing is made of an elastic material.

3. The inductive coupler of claim 1,
    wherein said housing is made of a resilient material, and
    wherein said gap, when said housing is at rest, assumes a substantially closed position.

4. The inductive coupler of claim 1, wherein said housing also maintains a position of said conductor relative to a position of said magnetic core, when said inductive coupler is installed on said conductor.

5. The inductive coupler of claim 1, further comprising a fastener that secures said gap in a closed position.

6. The inductive coupler of claim 5,
    wherein said housing includes a protrusion, and
    wherein said fastener is configured as a strap having a notch that engages said protrusion.

7. The inductive coupler of claim 6, wherein said fastener is a strap that is an integral component of said housing.

8. The inductive coupler of claim 1,
    wherein said housing includes an end face having a first flange and a second flange, and wherein said inductive coupler further comprises a band that encompasses said first and second flanges within a perimeter of said band, such that when said perimeter is reduced, said first and second flanges are drawn toward one another.

9. The inductive coupler of claim 8, wherein said band is selected from the group consisting of a cable tie and a rubber band.

10. The inductive coupler of claim 1,
wherein said housing includes an end face having a flange,
wherein said inductive coupler further comprises a cable tie, and
wherein, when said inductive coupler is installed on said conductor, said cable tie encompasses said flange and a portion of said conductor within a perimeter of said cable tie, such that when said perimeter is reduced, said flange and said conductor are drawn toward one another.

11. The inductive coupler of claim 1,
further comprising a band that bridges said gap,
wherein, when said inductive coupler is installed on said conductor, said conductor contacts said band at a point and exerts a force that moves said point away from said gap, and causes said gap to close.

12. The inductive coupler of claim 11, wherein said band is an integral component of said housing.

13. The inductive coupler of claim 1, further comprising:
a first member on a first side of said flexible region; and
a second member on a second side of said flexible region,
wherein said gap is opened when said first and second members are moved toward one another.

14. The inductive coupler of claim 13, wherein said first member is a strap that is an integral component of said housing.

15. The inductive coupler of claim 1, wherein said magnetic core and said winding are embedded in said housing.

16. The inductive coupler of claim 1, wherein said magnetic core has an exposed surface facing said aperture.

17. The inductive coupler of claim 1, further comprising an actuator that applies a force on said flexible region, to close said gap.

* * * * *